United States Patent [19]

Diehl et al.

[11] Patent Number: 5,523,345
[45] Date of Patent: Jun. 4, 1996

[54] LATEX BINDER COMPOSITIONS

[75] Inventors: David F. Diehl, Akron; Peter C. Hayes, Stow, both of Ohio

[73] Assignee: GenCorp Inc., Fairlawn, Ohio

[21] Appl. No.: 201,824

[22] Filed: Feb. 25, 1994

[51] Int. Cl.$^6$ .................................................. C08L 39/00
[52] U.S. Cl. .................... 524/555; 524/548; 526/303.1; 526/304; 526/262
[58] Field of Search .................. 524/555, 548; 526/304, 262, 303.1

[56] References Cited

U.S. PATENT DOCUMENTS

| | | | |
|---|---|---|---|
| 3,497,380 | 2/1970 | Weber | 117/155 |
| 3,594,337 | 7/1971 | Shea | 260/17.4 |
| 3,776,812 | 12/1973 | Jongetjes | 162/168 |
| 3,821,175 | 6/1974 | Daniels et al. | 260/80.73 |
| 3,912,674 | 10/1975 | Stahl | 260/23 |
| 4,018,647 | 4/1977 | Wietsma | 162/168 |
| 4,081,318 | 3/1978 | Wietsma | 162/157 |
| 4,289,676 | 9/1981 | Czauderna et al. | 524/555 |
| 4,378,272 | 3/1983 | Suwala et al. | 162/152 |
| 4,925,529 | 5/1990 | Dotzamer et al. | 162/152 |

FOREIGN PATENT DOCUMENTS 54-6903  1/1979  Japan.

*Primary Examiner*—Edward J. Cain
*Attorney, Agent, or Firm*—Robert F. Rywalski; Daniel J. Hudak

[57] ABSTRACT

A latex binder composition which is the reaction product of a conjugated diene monomer and a vinyl-substituted aromatic monomer along with minor amounts of other comonomers including acrylamide or a derivative thereof, methacrylic acid, N-methylolacrylamide, and optional unsaturated carboxylic acids, has an average particle size of less than 1,500 Å. The latex binder which has good stability can be used on nonwoven cellulosic based substrates to impart high wet tensile strength thereto.

7 Claims, No Drawings

LATEX BINDER COMPOSITIONS

FIELD OF INVENTION

The invention relates to aqueous latices and, more particularly, to synthetic latices of multicomponent copolymers which exhibit excellent long-term colloidal stability and which impart exceptional wet tensile strength to nonwoven cellulosic based substrates to which they are applied.

BACKGROUND

Various synthetic latices have heretofore been commonly used for bonding together filaments or fibers of nonwoven fabrics to form durable industrial wipes or toweling. Such compositions must meet a number of technical and practical requirements. In particular, the latex composition, after having been applied to a nonwoven cellulosic based substrate and subsequently dried, should produce a fabric which is soft, flexible, and nonabrasive, and which has good tensile strength when wetted by water or various solvents.

It is preferred that the latex compositions used as binders for nonwoven cellulosic based substrates should not cause undesirable discoloration or yellowing of the fabric. It is also preferred that such compositions exhibit good long-term colloidal stability and good mechanical stability under high shear to avoid excessive build-up of latex particles on spray nozzles used for applying the latex to the substrate.

Known synthetic latices suitable for binding the fibers of nonwoven substrates include aqueous emulsions of multi-component copolymers comprised primarily of styrene and butadiene. With such conventional prior art compositions, it has generally been necessary to utilize high amounts of melamine formaldehyde resins and/or high amounts of N-methylolacrylamide monomers.

A disadvantage with such compositions is that they contain or generate relatively high amounts of free formaldehyde which is now regarded as being highly undesirable from an environmental standpoint.

Accordingly, it would be highly desirable to provide an inexpensive latex binder capable of achieving high wet tear strength while reducing the need for melamine formaldehyde resins and/or N-methylolacrylamide monomers.

SUMMARY OF INVENTION

The compositions of the invention generally comprise a binder dispersed in water wherein the binder is the polymerization product of primary or principal monomers generally utilized in large amounts and other minor or secondary monomers utilized in lesser amounts. For purposes of clarity, the amounts of the various minor monomers are based upon 100 parts by weight of all of the primary monomers utilized. Of course, any proportion or fraction thereof can be utilized. The polymerization product is made from one or more conjugated diene primary monomers and one or more vinyl-substituted aromatic primary monomers. As noted, based upon 100 parts by weight of the primary monomers, that is the one or more conjugated dienes and the one or more vinyl substituted aromatic monomers, various other monomers are utilized such as from about 0.1 to about 3 parts by weight of an acrylamide monomer or derivative thereof, from about 0.1 to about 6 parts by weight of methacrylic acid, from about 0.1 to about 5 parts by weight of a N-methylolacrylamide monomer or derivative thereof, and optionally from about 0.1 to about 10 parts by weight of an unsaturated carboxylic acid monomer other than methacrylic acid.

It has been discovered that nonwoven cellulosic based substrates treated with the latex compositions of the invention generally have better wet tensile strength when the average particle size of the polymeric binder is small. More particularly, it has been discovered that a dramatic improvement in wet tensile strength is achieved when the average particle size is reduced from typical prior art dimensions of about 1,800 Å to below 1,500 Å.

Another aspect of the present invention involves the use of anionic alkylated disulfonated diphenyl oxide surfactants and/or alkyl sulfosuccinate surfactants to provide an emulsion polymerization of monomers capable of achieving a desired average particle size of the polymeric binder, good long-term colloidal stability, and a latex having low residual monomer levels.

DETAILED DESCRIPTION

The latex binder compositions of the invention are generally formed by emulsion polymerization techniques which are well known to the art and to the literature. The polymeric binder is comprised primarily of the reaction product of one or more conjugated diene monomers and one or more vinyl-substituted aromatic monomers.

Suitable conjugated diene monomers generally contain from about 4 to 8 carbon atoms and desirably from about 4 to 6 carbon atoms. Examples of specific diene monomers include piperylene, isoprene, 2,3-dimethyl-1,3-butadiene, and preferably butadiene. Mixtures of two or more conjugated dienes can also be utilized.

Suitable vinyl-substituted aromatic monomers generally contain from 8 to about 12 carbon atoms. Specific examples include alpha-methyl styrene, p-tertiary butyl styrene, methyl vinyl toluene, p-vinyl toluene, 3-ethyl styrene, and the like, with styrene being preferred. Mixtures of two or more vinyl-substituted aromatic monomers can also be utilized.

Based upon 100 parts by weight of the primary monomers, i.e., the one or more conjugated diene monomers and one or more vinyl-substituted aromatic monomers, the amount of conjugated dierio monomers is generally from about 30 to about 70 parts by weight, and preferably from about 50 to about 65 parts by weight. The amount of the one or more vinyl substituted aromatic monomers which is utilized is thus the difference based upon 100 parts by weight of the primary monomers and is hence generally from about 70 to about 30, and preferably from about 50 to about 35 parts by weight.

The polymeric binder also contains from about 0.1 to about 3 parts and desirably from about 0.5 parts to about 2.0 parts by weight per 100 parts by weight of the primary monomers (PHPM), that is, the one or more conjugated dierio monomers and the one or more vinyl-substituted aromatic monomers, of an acrylamide monomer or a derivative thereof, such as N-alkyl acrylamide, N,N-dialkyl acrylamide or dialkyl acrylamide, or a N,N-cycloalkyl acrylamide. The alkyl group generally has from 1 to 8 carbon atoms with specific examples including methyl, ethyl, and isopropyl. Examples of specific compounds include N,N-dimethyl-acrylamide and N,N-cyclohexyl acrylamide, with acrylamide being preferred.

The polymeric binder of the invention also include from about 0.1 to about 6 parts by weight and desirably from about 0.5 to about 2.0 parts by weight PHPM of mothacrylic acid to enhance colloidal stability. It is an important aspect of the present invention that the latex binder composition be free of or at the most contain small amounts of acrylic acid, that is generally less than 2 and desirably less than 0.5 parts by weight PHPM inasmuch as substantial amounts of this acid generally leads to colloidal instability.

The amount of N-methylolacrylamide monomer or derivative thereof is low and is from about 0.1 to about 5 parts by weight, desirably from about 0.5 to about 3 parts by weight, and preferably from about 1.0 to about 2.5 parts by weight PHPM. Such compounds generally include N-methylol-functional ethylenically unsaturated monomers including N-methylolamides of ethylenically unsaturated carboxylic acids having 3–10 carbons, such as N-methylolacrylamide, N-methylolmethacrylamide, N-methylolmaleimide, N-methylol-maleinamic acid, N-methylol-maleinamic acid esters, N-methylolamides of the vinyl aromatic acids such as N-methylol-p-vinylbenzamide, and the like.

Optional preferred monomers which can be used in forming the polymeric binders of the invention include one or more unsaturated carboxytic acids containing from about 3 to about 12 carbon atoms other than the above noted methacrylic acid and the absence or general exclusion of acrylic acid. Such monomers improve the colloidal stability of latex compositions and the amount thereof generally ranges from about 0.1 to about 10 parts by weight, desirably from about 0.5 to about 5 parts by weight, and preferably from about 1 to about 3 parts by weight PHPM. Examples of suitable unsaturated carboxylic acid monomers include maleic acid, citraconic acid, fumaric acid, itaconic acid, and the like, as well as combinations thereof. Fumaric and itaconic acid are preferred.

Other optional monomers which can be utilized to prepare the latex binder copolymers of the present invention include vinyl chloride, vinylidene chloride, and the like in amounts from about 0.1 to about 30 parts by weight and preferably from about 2 to about 15 parts by weight PHPM.

Still another optional monomer is acrylonitrile or various alkyl derivatives thereof wherein the alkyl group contains from 1 to 6 carbon atoms with specific examples including methacrylonitrile, crotononitrile, and 2-pentenenitrile. The amount of such optional monomers is generally from about 0.1 to about 30 and desirably from about 2 to about 15 parts by weight PHPM.

Still another optional monomer are the various alkyl-(meth) acrylate esters and hydroxyl derivatives thereof, wherein the alkyl portion has from 1 to about 10 carbon atoms with specific examples including butyl acrylate, 2-ethylhexyl acrylate, propyl acrylate, ethyl acrylate, hydroxyethyl acrylate, hydroxyethyl methacrylate, hydroxymethyl acrylate, hydroxymethyl methacrylate, and the like. The amounts of such ester monomers, when used can generally range from about 0.1 to about 30, and preferably from about 2 to about 15 parts by weight PHPM.

Chelating agents can be utilized during polymerization to tie-up various metal impurities as well as to achieve a uniform polymerization. The amounts of such chelating agents are generally small, such as from about 0.01 to about 0.25 parts by weight PHPM. Examples of suitable chelating agents include ethylene diamine tetraacetic acid, nitrilotriacetic acid, citric acid, and their ammonium, potassium, and sodium salts.

The above monomers are polymerized in the presence of water to form the latex binder of the present invention in accordance with conventional emulsion polymerization procedures and techniques. Free radical initiators are typically utilized as well as optional chain transfer agents.

The free radical initiators utilized to polymerize the various above-described latex binder-forming monomers include sodium persulfate, ammonium persulfate, potassium persulfate, and the like. Other free radical initiators can be utilized which decompose or become active at the temperature utilized during polymerization such as various peroxides, e.g., cumene hydroperoxide, dibenzoyl peroxide, diacetyl peroxide, dodecanoyl peroxide, di-t-butyl peroxide, dilauroyl peroxide, bis(p-methoxy benzoyl) peroxide, t-butyl peroxy pivalate, dicumyl peroxide, isopropyl percarbonate, di-sec-butyl peroxy dicarbonate, various azo initiators such as azobisdimethylvaleronitrile, 2,2'-azobisisobutyronitrile, 2,2'-azobis(2-amidinopropane) dihydrochloride, 2,2'-azobis-2-methylbutyronitrile, 2,2'-azobis(methylisobutyrate), and the like, and mixtures thereof. The amount of the free radical initiator is generally from about 0.25 to about 2.0, and preferably from about 0.5 to about 1.5 parts by weight PHPM.

Optional chain transfer agents include mercaptans such as the alkyl and/or aralkyl mercaptans having from 8 to about 18 carbon atoms and preferably from about 12 to about 14 carbon atoms. The tertiary alkyl mercaptans having from 12 to 14 carbon atoms are highly preferred. Examples of suitable mercaptans include N-octyl mercaptan, N-dodecyl mercaptan, t-octyl mercaptan, t-dodecyl mercaptan, tridecyl mercaptan, tetradecyl mercaptan, hexadecyl mercaptan, and the like, as well as mixtures thereof. The amount of the chain transfer agent utilized is generally, from about 0.01 to about 5 parts by weight PHPM.

In accordance with an important aspect of the invention, the emulsifiers or surfactants utilized are preferably an alkylated disulfonated diphenyl oxide surfactant and/or an alkyl sulfosuccinate surfactant. Suitable alkylated disulfonated diphenyl oxide surfactants are generally represented by the formula:

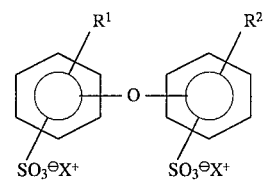

wherein $R^1$ and $R^2$, independently are hydrogen or a linear, branched, or cycloalkyl containing from about 6 to about 16 carbon atoms, preferably from about 10 to about 14 carbon atoms, provided that $R^1$ and $R^2$ are not both hydrogen, and X, independently is a suitable cation. Suitable cations include sodium and other alkali metal ions, alkyl quaternary amine ions wherein the alkyl group has from 1 to 6 carbon atoms such as triethyl quaternary amine and isopropyl quaternary amine, as well as other organic cations.

Preferred diphenyl oxide surfactants include compounds wherein X is sodium and $R^1$ and $R^2$, independently, are hydrogen and dodecyl, or dodecyl and dodecyl, respectively. Such surfactants are commercially available from Dow Chemical as Dowfax 2A1.

Suitable alkyl sulfosuccinate surfactants include those represented by the formula:

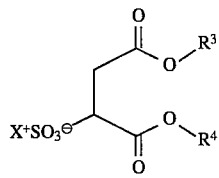

wherein $R^3$ and $R^4$ are, independently, a branched, linear, or cycloalkyl group containing from 4 to about 18 carbon atoms, desirably from 4 to 8 carbon atoms, and X is a suitable cation. Suitable cations for the alkylated sulfosuccinate surfactant are generally the same as those for the alkylated disulfonated diphenyl oxide surfactant with the sodium cation being preferred. Preferred $R^3$ and $R^4$ groups include butyl, hexyl, or a cyclohexyl group with a preferred X group being sodium. A particularly preferred alkylated surfactant is sodium dicyclohexyl sulfosuccinate which is available from Cytex Industries as Aerosol A196, and sodium dihexyl sulfosuccinate available as Aerosol MA.

The alkylated disulfonated diphenyl oxide surfactants, when used alone, are generally present in amounts ranging from about 0.1 to about 3 parts, and desirably from about 0.50 to about 1.5 parts by weight PHPM.

The alkyl sulfosuccinate surfactants are generally utilized in amounts ranging from about 0.1 to about 3.0 parts by weight and desirably from about 0.5 to about 1.5 part by weight PHPM. Desirably, the various alkylated disulfonated diphenyl oxide surfactants are used in combination with the alkyl sulfosuccinate surfactants.

Various anionic surfactants can be utilized, such as various alkyl sulfates, various alkyl aryl sulfonates, various α-olefin sulfonates, various amine salts, and the like, wherein the alkyl portion generally has from about 6 to about 20 carbon atoms such as sodium lauryl sulfate, sodium dodecyl sulfate, and sodium dodecyl benzene sulfonate. However, inasmuch as such surfactants generally yield unsuitable properties such as colloidal stability, wet tensile strength and the like, when utilized, the amount thereof is generally one part or less by weight, desirably 0.5 parts or less by weight, and preferably 0.25 parts by weight or less PHPM.

Another advantage is that the latex binder compositions of the present invention generally have a reduced formaldehyde content of generally less than 150 parts per million, desirably less than 100 parts per million and preferably less than 75 parts per million of formaldehyde for every 100 parts by weight of latex binder.

Still another advantage of the latex binder composition per se is that manufacture of the polymer binder is relative easy due to improved colloidal stability, lack of build-up of solid polymer in walls of the reactor, and lower amounts of coagulant dispersed in the latex.

The various latex-forming monomers of the present invention are polymerized by free radicals by any conventional method including batch, incremental, or continuous, in the presence of an effective amount of water to enable the formation of an emulsion as well as proper mixing of the various additives, heat transfer, and the like. Polymerization is generally carried out from about 55° C. to about 95° C., and desirably from about 60° C. to about 75° C. Polymerization is generally conducted in an acidic medium when acidic monomers are utilized and the pH of the latex binder is generally from about 1.5 to about 6.5 with from about 2.0 to about 4.0 being preferred. The amount of solids, that is, the copolymer or binder, is generally from about 35 to about 60, and preferably from about 40 to about 50 percent by weight based upon the total weight of the binder and the remaining ingredients, for example, water.

In accordance with the principles of the invention, the average particle size of the binders after filtering is generally from about 1,000 to about 1,500 Å, and more preferably from about 1,200 to about 1,400 Å. It is believed that the lower particle sizes, as compared with the prior art which generally ranges from about 1,800 to 2,100 Å, are particularly responsible for the improved wet tear strength of non-woven cellulosic based or polyester based substrates which have been treated with the latex binder of the invention.

The latex binder compositions of the invention have been found to exhibit good long-term colloidal stability, that is, the polymeric binder particles do not tend to coagulate or agglomerate to render the composition useless for its intended purpose. Thus, very low levels of coagulant, especially fine-size coagulants such as would be retained on a 325 Tyler mesh, exist after filtering of the latex. Such levels are generally 0.1 percent or less, desirably 0.05 percent or less, and more desirably 0.02 percent or less, and preferably 0.01 percent or less by weight based upon the total weight of the latex solids. Another advantage of the present invention is high conversion of all the monomers such as at least 95 percent thereof, desirably at least 97 or 98 percent and preferably at least 99 percent of all monomers.

The latex binder of the present invention has many applications and can be utilized on non-woven cellulosic based substrates such as paper, cotton, and the like wherein the majority amount of the substrate is a natural organic material. The substrate can also include minor amounts of other fibers such as polyester, nylons, acrylates, and the like. Examples of such substrates include paper towels, various paper tapes, paper containers, industrial towels, industrial wipes, and the like.

The latex binder can also be applied to various nonwoven fibers such as polyester, polypropylene, rayon, nylon, and other synthetic fibers, and combinations thereof.

With regard to the present invention, "high wet tensile strength" means that the fabric has a high tensile strength when saturated with water or an organic solvent such as toluene, mineral spirits, or heptane.

The invention will be better understood by reference to the following examples which serve to illustrate but not limit the invention.

EXAMPLES

Apparatus

A one-gallon, stainless steel pressure reactor equipped with monomer addition ports, stirrer and temperature and pressure measurement devices was used. Cooling was provided by an external water bath.

Example 1

A mixture of deionized water 1000 g, Dowfax 2A1 (15 percent) 50g, itaconic acid 22g, Aerosol A196 (10 percent) 150g, EDTA solution (40 percent) 4 g and styrene 112 g were stirred and heated to 65° C. (under nitrogen). A solution of sodium persulfate 7.5 g in deionized water 142 g was then added to the reactor. After 30 minutes, the monomer and aqueous streams, as set forth in Table I were added to the reactor at 60° C. over a period of 5½ hours.

After 5.5 hours, the temperature was raised to 71° C. and the reaction continued for 4 hours (total solids approximately 45 percent). The pH of the latex binder was 2.5. The conversion of monomers to polymer was 99 percent.

TABLE I

| AQUEOUS STREAM | MONOMER STREAM |
|---|---|
| D. I. Water 330 g | Styrene 522 g |
| Dowfax 2A1 (15%) 80 g | Butadiene 732 g |
| | Acrylamide (50%) 75.3 g |
| | Divinyl Benzene (55%) 7.5 g |
| | Methacrylic Acid 30 g |
| | N-Methylolacrylamide (48%) 78 g |
| | Dodecyl Mercaptan 7.5 g |

Post Addition restorage and Stability

The following was added to the reactor and then the latex was steam-stripped and filtered in a conventional manner.

Dowfax 2A1 (15 percent) 20 g, D.I. water 82 g, 28% ammonia 25 g, DREW L 198 antifoam 4 g, Proxel GXL (25%) biocide 8 g, Bostex 490B (35%) antioxidant 45 g.

| Properties: | |
|---|---|
| Total solids content: | 44.6 percent |
| pH: | 6.8 |
| Surface tension: | 47 dynes/cm |
| Brookfield viscosity: | 500 cps |
| Particle size: | 1280 Å |
| Coagulation collected on 325 Tyler mesh: | 0.1 grams |

Although the tensile strengths of latex compositions 3 and 4 are somewhat similar to Example 1, the conversion of monomers to polymer was too low to be practical and the levels of coagulum retained on 325 mesh was unduly high at 6g for Example 3 and 7 g for Example 4.

Each of the latexes in Table II were applied to Whatman sheets and dried at room temperature and then cured for 5 minutes at 315° F. (158° C.). The amount of latex applied in each case was 20 percent by weight (45 percent solids) of the total weight of the latex and paper.

The dried sheets where then tested for wet tensile strength (in water), and solvent tensile strength using a variety of different solvents such as toluene, heptane, mineral spirits. The solvent tensile test is an average tensile strength of paper soaked in toluene, heptane and mineral spirits for a period of 3 hours and tested immediately thereafter without drying. The results indicate that the latex compositions of the invention have much better wet tear strength and average solvent tear strength than the control (Example 2).

The results demonstrate the effectiveness of the composition of Example 1. The higher wet tensile strength of this latex when formulated in a non-woven system allows for the reduction or elimination of melamine formaldehyde resins with a reduction in formaldehyde dehyde content of approximately 66 percent ( 300 ppm versus 100 ppm HCHO).

TABLE II

| EXAMPLE | SURFACTANT SYSTEM | MONOMER CONVERSION (%) | WET TENSILE (LBS.) | AVERAGE SOLVENT TENSILE (LBS.) | PARTICLE SIZE (Å) |
|---|---|---|---|---|---|
| 1 | Dowfax 2A1/ Aerosol A196 | 99 | 33 | 40 | 1280 |
| 2 (Control) | Aerosol MA 80 | 97 | 23 | 33 | 2000 |
| 3 | Avirol 2020 (SDS) | 88 | 30 | 36 | 770 |
| 4 | Siponate LDS (SDBS) | 79.6 | 29 | 37 | 772 |

Aerosol MA 80 = Sodium Dihexyl Sulfosuccinate.
SDS = Sodium Dodecyl Sulfate.
SDBS = Sodium Dodecyl Benzene Sulfonate.

Example 2

A binder composition having only 16.9 g of Aerosol MA (80%) instead of Aerosol A196 and Dowfax 2A1 as in Example 1, was prepared by a similar process and method. The properties of this binder are shown in Table II. It can be seen that the particle size is rather large and that the tensile strengths are inferior to those of Example 1.

Examples 3 and 4

In a similar fashion to Example 1, the Aerosol A196 and Dowfax 2A1 were replaced on an equal weight basis with sodium dodecyl sulfate (Example 3) and sodium dodecyl benzene sulfonate (Example 4). These surfactants are outside the scope of the surfactants of the present invention.

While in accordance with the patent statutes the best mode and preferred embodiment has been set forth, the scope of the invention is not limited thereto, but rather by the scope of the attached claims.

What is claimed is:

1. A latex binder composition comprising;
   a binder dispersed in water, said binder being the reaction product of monomers consisting essentially of
   (a) from about 30 to about 70 parts by weight of one or more conjugated diene monomers having from 4 to 8 carbon atoms and (b) from about 70 to about 30 parts by weight of one or more vinyl-substituted aromatic monomers having from 8 to 12 carbon atoms, the total amount of said (a) and (b) monomers being 100 parts by weight, and from about 0.1 to about 3 parts by weight of an acrylamide monomer or a derivative thereof wherein said derivative is N-alkyl acrylamide, N,N-dialkyl acrylamide, dialkyl acrylamide or N,N-cycloalkyl acrylamide, or combinations thereof, and wherein said alkyl group has from 1 to 8 carbon atoms, and optionally from about 0.1 to about 10 parts by weight of an unsaturated carboxylic acid monomer other than methacrylic acid and less than 2 parts by weight of acrylic acid, for every 100 parts by weight of said one or more (a) and (b) monomers, and from about 0.1 to about 6 parts by weight of a methacrylic acid monomer and from about 0.1 to about 5 parts by weight of N-methylol-functional ethylenically unsaturated monomer which is N-methylolacrylamide or N-methylolmethacramide or both including derivatives thereof, for every 100 parts by weight of said (a) and (b) monomers, and said latex binder having an average particle size of less than 1,500 Å.

2. A latex binder according to claim 1, wherein said particle size is from about 1,000 Å to about 1,500 Å.

3. A latex binder according to claim 2, wherein the amount of said optical acrylic acid is less than 0.5 parts by weight, wherein said binder has a formaldehyde content of less than 150 parts by weight per million parts by weight of said latex binder, wherein said latex has less than 0.1 percent by weight of coagulant retained on 325 Tyler mesh based upon the total weight of the solids of said latex binder composition, and wherein the conversion of all of said monomers is at least 95 percent.

4. A latex binder composition according to claim 3, wherein said (a) conjugated diene monomer is butadiene, wherein said (b) vinyl substituted aromatic monomer is styrene, wherein the amount of said butadiene monomer is from about 50 to about 65 parts by weight, wherein the amount of said styrene monomer is from about 50 to about 35 parts by weight, wherein said acrylamide monomer or derivative thereof is acrylamide in an amount of from about 0.5 to about 2.0 parts by weight, wherein the amount of said methacrylic acid is from about 0.5 to about 2.0 parts by weight, wherein said N-methylol-functional type compound is N-methylolacrylamide in an amount of from about 0.5 to about 3 parts by weight, wherein said particle size is from about 1,200 to about 1,400 Å, and wherein said formaldehyde content is less than 100 parts per million.

5. A latex binder composition comprising; a binder dispersed in water, said binder being the reaction product of monomers consisting essentially of (a) from about 30 to about 70 parts by weight of one or more conjugated diene monomers having from 4 to 8 carbon atoms and (b) from about 70 to about 30 parts by weight of one or more vinyl-substituted aromatic monomers having from 8 to 12 carbon atoms, the total amount of said (a) and (b) monomers being 100 parts by weight, and from about 0.1 to about 3 parts by weight of an acrylamide monomer or a derivative thereof wherein said derivative is N-alkyl acrylamide, N,N-dialkyl acrylamide, dialkyl acrylamide, or N,N-cycloalkyl acrylamide, or combinations thereof, and wherein said alkyl group has from 1 to 8 carbon atoms, from about 0.1 to about 6 parts by weight of methacrylic acid, and from about 0.1 to about 5 parts by weight of N-methylol-functional ethylenically unsaturated monomer which is N-methylolacrylamide or N-methylolmethacrylamide or both including derivatives thereof, and optionally from about 0.1 to about 10 parts by weight of an unsaturated carboxylic acid monomer other than methacrylic acid and less than 2 parts by weight of acrylic acid, for every 100 parts by weight of said one or more (a) and (b) monomers, said latex binder having an average particle size of less than 1,500 Å, the conversion of said monomers being at least 95 percent, and said binder having a formaldehyde content of less than 150 parts by weight per million parts by weight of said binder, and from about 0.1 to about 3 parts by weight of an alkylated disulfonated diphenyl oxide surfactant or from about 0.2 to about 2.0 parts by weight of an alkyl sulfosuccinate surfactant, or combinations thereof, for every 100 parts by weight of said primary monomers.

6. A latex binder composition according to claim 5, wherein said particles size is from about 1,200 to about 1,400 Å, wherein said alkylated disolfonated diphenyoxide surfactant is sodium dodecyldiphenyloxide disulfonic acid, wherein said alkyl sulfosuccinate surfactant is sodium dicyclophexyl sulfosuccinate, wherein said conversion of said monomers is at least 98 percent, and wherein said formaldehyde level is 100 parts by weight or less per million parts by weight of said binder.

7. A latex bindex composition, comprising;

a binder dispersed in water, said binder being the polymerization product of monomers comprising;

(a) from about 30 to about 70 parts by weight of one or more conjugated diene monomers having from 4 to 8 carbon atoms and (b) from about 70 to about 30 parts by weight of one or more vinyl-substituted aromatic monomers having from 8 to 12 carbon atoms, the total amount of said (a) and (b) monomers being 100 parts by weight, and from about 0.1 to about 6 parts by weight of mothacrylic acid, and optionally from about 0.1 to about 10 parts by weight of an unsaturated carboxylic acid monomer other than mothacrylic acid and less than 2 parts by weight of acrylic acid, for every 100 parts by weight of said one or more (a) and (b) monomers, and amide-containing monomers consisting of 1) an acrylamide monomer or a derivative thereof wherein said derivative is an N-alkyl acrylamide, N,N-dialkyl acrylamide, dialkyl acrylamide, or N,N-cycloalkyl acrylamide, or combinations thereof, wherein said alkyl portion has from 1 to 8 carbon atoms, and 2) an N-methylolacrylamide monomer or an N-methylolmethacrylamide monomer or both or a derivative thereof, wherein the amount of said acrylamide monomer or derivative thereof is from about 0.1 to about 3 parts by weight and wherein the amount of said N-methylolacrylamide or said N-methylolmethacrylamide monomer or both or a derivative thereof is from about 0.1 to about 5 parts by weight, for every 100 parts by weight of said one or more (a) and (b) monomers, said binder having an average particle size of less than 1,500 Å, and having a formaldehyde content of less than 150 parts by weight per million parts by weight of said binder.

* * * * *